United States Patent
Fujito et al.

(10) Patent No.: US 8,022,413 B2
(45) Date of Patent: Sep. 20, 2011

(54) GROUP III NITRIDE SEMICONDUCTOR SUBSTRATE AND METHOD FOR CLEANING THE SAME

(75) Inventors: Kenji Fujito, Ibaraki (JP); Hirotaka Oota, Ibaraki (JP); Shuichi Kubo, Ibaraki (JP)

(73) Assignee: Misubishi Chemical Corporation, Tokyo (JP)

( * ) Notice: Subject to any disclaimer, the term of this patent is extended or adjusted under 35 U.S.C. 154(b) by 0 days.

(21) Appl. No.: 13/082,916

(22) Filed: Apr. 8, 2011

(65) Prior Publication Data

US 2011/0180904 A1    Jul. 28, 2011

Related U.S. Application Data

(63) Continuation of application No. 12/669,610, filed as application No. PCT/JP2008/001813 on Jul. 8, 2008, now Pat. No. 7,928,446.

(30) Foreign Application Priority Data

Jul. 19, 2007   (JP) .................................. 2007-188603

(51) Int. Cl.
    *H01L 29/15*   (2006.01)
(52) U.S. Cl. .................. 257/76; 257/615; 257/E29.089
(58) Field of Classification Search .................. 257/76, 257/615, E29.089
    See application file for complete search history.

(56) References Cited

U.S. PATENT DOCUMENTS

| | | | |
|---|---|---|---|
| 6,252,261 B1 | 6/2001 | Usui et al. | |
| 6,524,966 B1 | 2/2003 | Wright et al. | |
| 7,125,801 B2 * | 10/2006 | Minemoto et al. | 438/691 |
| 7,829,443 B2 * | 11/2010 | Seifert et al. | 438/478 |
| 2004/0221799 A1 | 11/2004 | Nakayama et al. | |
| 2005/0067622 A1 | 3/2005 | Nakata | |
| 2006/0280668 A1 * | 12/2006 | Dmitriev et al. | 423/412 |
| 2009/0291567 A1 * | 11/2009 | Hachigo et al. | 438/758 |

FOREIGN PATENT DOCUMENTS

| | | |
|---|---|---|
| JP | 7-506616 | 7/1995 |
| JP | 7-263430 | 10/1995 |
| JP | 9-92636 | 4/1997 |
| JP | 9-279189 | 10/1997 |
| JP | 10-4074 | 1/1998 |
| JP | 10-256215 | 9/1998 |
| JP | 11-67632 | 3/1999 |
| JP | 2000-196188 | 7/2000 |
| JP | 2000-252265 | 9/2000 |
| JP | 2001-508239 | 6/2001 |
| JP | 2002 203793 | 7/2002 |
| JP | 2002-289569 | 10/2002 |
| JP | 2003-507901 | 2/2003 |
| JP | 2003 300800 | 10/2003 |
| JP | 2004-502298 | 1/2004 |
| JP | 2004-253524 | 9/2004 |
| JP | 2004 284942 | 10/2004 |
| JP | 2004 356609 | 12/2004 |
| JP | 2005-502734 | 1/2005 |
| JP | 2005-522027 | 7/2005 |
| JP | 2005-243719 | 9/2005 |
| JP | 2007-67182 | 3/2007 |
| WO | 93/23493 | 11/1993 |
| WO | 98/30667 | 7/1998 |
| WO | 01/05524 A1 | 1/2001 |
| WO | 02/01608 A2 | 1/2002 |
| WO | 02/077120 A1 | 10/2002 |
| WO | 03/083582 A1 | 10/2003 |

OTHER PUBLICATIONS

"Leading Trends", Nikkei Electronics, Aug. 14, 2006, pp. 65-70.
"Crystal Growth and Device Application", Seminar in Kansai Branch of the Japan Society of Applied Physics, Mar. 12, 2007, 2 pages.
K. Hiramatsu, et al., "Recent Progress in Selective Area Growth and Epitaxial Lateral Overgrowth of III-Nitrides: Effects of Reactor Pressure in MOVPE Growth", Physica Status Solidi (a), Proceedings: the Third International Conference on Nitride Semiconductors (ICNS'99), vol. 176, No. 1, Nov. 1999, pp. 535-543 and cover page.
A. R. Smith, et al., "Reconstructions of the GaN(0001) Surface", Physical Review Letters, vol. 79, No. 20, Nov. 17, 1997, pp. 3934-3937 and cover page.

* cited by examiner

*Primary Examiner* — Trung Q Dang
(74) *Attorney, Agent, or Firm* — Oblon, Spivak, McClelland, Maier & Neustadt, L.L.P.

(57) ABSTRACT

A Group-III nitride semiconductor substrate having a flat surface with a dangling bond density of higher than 14.0 nm$^{-2}$ is produced by cleaning the surface having a dangling bond density of higher than 14.0 nm$^{-2}$ with a cleaning agent containing an ammonium salt.

8 Claims, No Drawings

GROUP III NITRIDE SEMICONDUCTOR SUBSTRATE AND METHOD FOR CLEANING THE SAME

CROSS-REFERENCE TO RELATED APPLICATIONS

The present application claims the benefit of priority to U.S. application Ser. No. 12/669,610, filed Jan. 19, 2010. The contents of that application are incorporated herein by reference in their entirety. U.S. application Ser. No. 12/669,610 is a national stage of PCT Application No. PCT/JP08/001,813, filed Jul. 8, 2008, which claims the benefit of priority to Japanese Patent Application No. 2007-188603, filed Jul. 19, 2007.

TECHNICAL FIELD

The present invention relates to a Group-III nitride semiconductor substrate having a flat surface with a dangling bond density of higher than 14.0 nm$^{-2}$, and to a cleaning method for producing it.

BACKGROUND ART

A Group-III nitride semiconductor such as gallium nitride and the like is useful as a substance applicable to light-emitting devices such as light-emitting diode, laser diode, etc., and to high-frequency and high-power electronic devices such as HEMT, HBT, etc. Accordingly, needed is a Group-III nitride semiconductor substrate having good crystallinity and having a flat surface.

For example, regarding GaN substrates, those having, as the main face thereof, a (0001) plane (hereinafter referred to as +c plane) are the most popular at present. The main face as referred to herein means the face to form a device, or the broadest face of a substrate. The GaN substrate having a main face of +c plane is produced first by polishing the +c plane of a GaN crystal with abrasive particles, and then cleaning it with an acidic solution such as HF or the like, or a basic solution such as KOH or the like to remove the abrasive particles. The +c plane is extremely stable to various acids and alkalis, and therefore a GaN substrate having a flat and clean +c plane as the main face thereof is provided.

However, it is said that devices comprising a GaN substrate with a +c plane as the main face thereof have some problems. Specifically, InGaN-based blue or green LED and LD comprising a GaN substrate with a +c plane as the main face thereof have a problem in that a piezoelectric field forms in the direction of the growth axis, c-axis thereof. The piezoelectric field forms through piezoelectric polarization caused by deformation of the crystal structure of the InGaN layer, and owing to the polarization, the hole and the electron injected in the light-emitting layer separate from each other thereby reducing the recombination possibility that contributes toward light emission. As a result, a problem is pointed out in that the internal quantum efficiency lowers thereby resulting in the reduction in the external quantum efficiency (Non-Patent Reference 1).

Accordingly, for reducing the influence of the piezoelectric field, studies of InGaN-based blue or green LED and LD are being actively made, which have, as the growth surface thereof, a non-polar plane such as an a plane or an m plane vertical to the +c plane of the GaN crystal, or a semi-polar plane inclined relative to the +c plane. The a plane as referred to herein indicates a (11-20) plane and a plane equivalent thereto in a hexagonal crystal, and is concretely a generic term for (11-20) plane, (-1-120) plane, (1-210) plane (-12-10) plane, (-2110) plane and (2-1-10) plane. The m plane indicates a (1-100) plane and a plane equivalent thereto in a hexagonal crystal, and is concretely a generic term for (1-100) plane, (-1100) plane, (01-10) plane (0-110) plane, (10-10) plane and (-1010) plane.

However, in a case of a GaN substrate having, as the main face thereof, a semi-polar plane or a (000-1) plane (hereinafter referred to as –c plane) having a dangling bond density of more than 14.0 nm$^{-2}$, the surface chemical reactivity is high, and therefore it has a problem in that, when cleaned with an acidic solution such as HF or the like or an alkaline solution such as KOH or the like, then its surface is roughened. For example, it is reported that the surface RMS of a GaN crystal, of which the (11-22) plane has been polished and cleaned, is 2.65 nm (Non-Patent Reference 2).

Non-Patent Reference 1: Nikkei Electronics, 14.8.2006, pp. 65-70,

Non-Patent Reference 2: Seminar in the Kansai Branch of the Japan Society of Applied Physics, "Crystal Growth and Device Application", Mar. 12, 2007.

DISCLOSURE OF THE INVENTION

Problems that the Invention is to Solve

Recently, semiconductors devices and others using the semi-polar plane of a Group-III nitride crystal have become produced, and a semi-polar plane of a Group-III nitride crystal having a high plane accuracy has become desired. Accordingly, it is desired to provide efficiently and in a simplified manner a Group-III nitride semiconductor substrate having, as the main face thereof, a surface that is flat and has a large dangling bond density value.

When it is desired to produce a Group-III nitride semiconductor substrate having a flat surface with a dangling bond density of higher than 14.0 nm$^{-2}$, then the substrate must be polished with an abrasive that contains abrasive particles having an extremely small particle size (for example, abrasive particles having a particle size of at most 200 nm) at least in the final stage of the polishing process, for the purpose of enhancing the surface flatness of the substrate. However, abrasive particles having a particle size of at most 200 nm often remain on the polished surface, and are difficult to remove from the surface. Accordingly, when the polished substrate is cleaned with an acidic solution such as HF or the like used for polishing +c plane, then the polished surface is eroded and roughened and could not give a desired surface. On the other hand, when it is cleaned with an alkaline solution such as KOH or the like, then the surface is eroded and roughed and, in addition, the abrasive particles could not be completely removed.

To solve these prior-art problems, the present inventors have set, for an object of the invention, provision of a Group-III nitride semiconductor substrate having a flat surface with a dangling bond density of higher than 14.0 nm$^{-2}$ and a cleaning method for producing it. In particular, the object is to remove abrasive particles from a Group-III nitride semiconductor substrate with a surface which has a dangling bond density of higher than 14.0 nm$^{-2}$ and which has been polished with abrasive particles having a particle size of at most 200 nm, not roughing the substrate surface.

Means for Solving the Problems

The present inventors have assiduously studied and, as a result, have found that, when a Group-III nitride semiconductor substrate is cleaned with a cleaning agent containing a specific type of a compound, then the prior-art problems can be solved. Specifically, as means for solving the problems, the inventors have provided the invention mentioned below.

[1] A cleaning method for a Group-III nitride semiconductor substrate, comprising cleaning a surface of a Group-III nitride semiconductor substrate that has a dangling bond density of higher than 14.0 $nm^{-2}$, with a cleaning agent containing an ammonium salt.

[2] The cleaning method for a Group-III nitride semiconductor substrate of [1], wherein the surface having a dangling bond density of higher than 14.0 $nm^{-2}$ is the broadest surface of the Group-III nitride semiconductor substrate.

[3] The cleaning method for a Group-III nitride semiconductor substrate of [1] or [2], wherein particles having a particle size of at most 200 nm adhere to the surface of the Group-III nitride semiconductor substrate before cleaned.

[4] The cleaning method for a Group-III nitride semiconductor substrate of any one of [1] to [3], wherein the surface having a dangling bond density of higher than 14.0 $nm^{-2}$ is polished with an abrasive agent containing abrasive particles having a particle size of at most 200 nm, before cleaned.

[5] The cleaning method for a Group-III nitride semiconductor substrate of [4], wherein the abrasive particles are colloidal silica.

[6] The cleaning method for a Group-III nitride semiconductor substrate of any one of [1] to [5], wherein the ammonium salt is $NH_4F$ or $NH_4Cl$.

[7] The cleaning method for a Group-III nitride semiconductor substrate of any one of [1] to [6], wherein the pH of the cleaning agent is from 6.5 to 8.0.

[8] The cleaning method for a Group-III nitride semiconductor substrate of any one of [1] to [7], wherein the Group-III nitride semiconductor substrate is cleaned by dipping it in the cleaning agent.

[9] A Group-III nitride semiconductor substrate containing a surface that has a dangling bond density of higher than 14.0 $nm^{-2}$ and has a surface roughness (RMS) of at most 0.1 nm.

[10] The Group-III nitride semiconductor substrate of [9], wherein the surface having a dangling bond density of higher than 14.0 $nm^{-2}$ and having a surface roughness (RMS) of at most 0.1 nm is a (11-22) plane.

[11] The Group-III nitride semiconductor substrate of [9], wherein the surface having a dangling bond density of higher than 14.0 $nm^{-2}$ and having a surface roughness (RMS) of at most 0.1 nm is a (10-1-1) plane.

[12] The Group-III nitride semiconductor substrate of [9], wherein the surface having a dangling bond density of higher than 14.0 $nm^{-2}$ and having a surface roughness (RMS) of at most 0.1 nm is a (000-1) plane.

[13] The Group-III nitride semiconductor substrate of [9], wherein the surface having a dangling bond density of higher than 14.0 $nm^{-2}$ and having a surface roughness (RMS) of at most 0.1 nm is a (1-101) plane.

[14] The Group-III nitride semiconductor substrate of [9], wherein the surface having a dangling bond density of higher than 14.0 $nm^{-2}$ and having a surface roughness (RMS) of at most 0.1 nm is a (10-12) plane.

[15] The Group-III nitride semiconductor substrate of anyone of [8] to [14], wherein the Group-III nitride semiconductor substrate is a GaN substrate.

Effect of the Invention

According to the invention, a Group-III nitride semiconductor substrate having a flat surface with a dangling bond density of higher than 14.0 $nm^{-2}$ can be provided efficiently and in a simplified manner. Also according to the invention, abrasive particles having a small particle size and remaining on the surface of a Group-III nitride semiconductor substrate after the polishing step thereof can be removed in a simplified manner.

BEST MODE FOR CARRYING OUT THE INVENTION

Regarding the Group-III nitride semiconductor substrate and its cleaning method of the invention, a typical production process for the Group-III nitride semiconductor substrate is described in detail hereinunder. In general, the Group-III nitride semiconductor substrate of the invention can be produced according to a process of growing a Group-III nitride crystal, and shaping, polishing and cleaning it. The description of the constitutive elements of the invention given hereinunder is for some typical embodiments of the invention, to which, however, the invention should not be limited. In this description, the numerical range expressed by the wording "a number to another number" means the range that falls between the former number indicating the lowermost limit of the range and the latter number indicating the uppermost limit thereof.

<<Growth of Group-III Nitride Crystal>>
(Method for Growing Crystal)

The production method for the Group-III nitride crystal to constitute the Group-III nitride semiconductor substrate of the invention is not specifically defined; and the crystal may be produced according to an HVPE method, an ammonothermal method, an MOCVD method, an MBE method, an LPE method, a sublimation method or the like. Of those, preferred are an HVPE method, an ammonothermal method and an LPE method, in which the growing speed is high and which are economical.

Preferred Embodiment of Crystal

The type of the Group-III nitride crystal is not specifically defined. For example, it includes GaN, InN, AlN, InGaN, AlGaN, AlInGaN, AlInGaN, etc. Preferred are GaN, AlN, AlGaN; and more preferred is GaN. For example, the thickness in the c-axis direction of the GaN crystal is preferably at least 500 more preferably at least 1 mm, even more preferably at least 3 mm, still more preferably at least 5 mm. The crystal having a thickness of at least 5 mm has the advantage that the area of the surface thereof having a dangling bond density of higher than 14.0 $nm^{-2}$, which is to be sliced, may be large and the substrate is easy to handle.

Preferably, the density of dislocation running in the c-axis direction of the Group-III nitride crystal is at most $1 \times 10^9$ $cm^{-2}$, more preferably at most $1 \times 10^7$ $cm^{-2}$, even more preferably at most $1 \times 10^6$ $cm^{-2}$, still more preferably at most $1 \times 10^5$ $cm^{-2}$. The density of dislocation running in the c-axis direction as referred to herein is one measured in the c-axis direction of the Group-III nitride crystal, according to a transmission electronic microscope (TEM) method or a cathodeluminescence (CL) method.

Preferably, the electronic carrier density of the Group-III nitride crystal is at least $1 \times 10^{17}$ $cm^{-3}$, more preferably at least $1 \times 10^{18}$ $cm^{-3}$. When the density is at least $1 \times 10^{18}$ $cm^{-3}$, then the driving voltage of the device formed on the substrate of the Group-III nitride crystal could be lowered.

<<Formation of Group-III Nitride Semiconductor Substrate>>
(Shaping Method)

The obtained Group-III nitride crystal is formed into a shape favorable for use as a Group-III nitride semiconductor substrate. Its concrete shape may be suitably determined depending of the object for use and on the embodiment of use of the Group-III nitride semiconductor substrate.

As an ordinary production method for a Group-III nitride semiconductor substrate, there may be mentioned a method of slicing a semiconductor ingot in the necessary plane direction thereof and beveling it. For slicing and beveling, an ordinary working method may be suitably selected from those generally employed for ordinary crystals. For example, in slicing, preferably employed is a method of slicing the crystal with a wire saw using diamond abrasive particles; and in beveling, preferably employed is a method of working the crystal by applying it to a rotating grindstone.

(Dangling Bond Density)

In shaping, the crystal is so shaped that the Group-III nitride semiconductor substrate obtained after the shaping could have a surface having a dangling bond density of higher than $14.0\ nm^{-2}$.

The dangling bond is a free bond of an atom. In a semiconductor crystal, an atom near the crystal surface or the crystal defect may have a free bond missing a partner for covalent bonding thereto and is therefore occupied by electrons not participating in bonding (unpaired electrons). This bond is called a dangling bond. The dangling bond density is the number of the dangling bonds from both the Ga atom and the N atom per unit area. For example, the dangling bond density of $14.0\ nm^{-2}$ means that there exist 14 dangling bonds on average from both the Ga atom and the N atom per $1\ nm^2$ of the surface.

The dangling bond density in a specific surface of a Group-III nitride crystal is reported, for example, in Physica Statsu Solidi (a), Vol. 176, p. 535 (1999), Hiramatsu et al., in which the density is $11.4\ nm^{-2}$ in the +c plane of a GaN crystal, $16.0\ nm^{-2}$ in the (1-101) plane thereof, $12.1\ nm^{-2}$ in the (1-100) plane thereof, $17.8\ nm^{-2}$ in the (11-22) plane thereof, and $14.0\ nm^{-2}$ in the (11-20) plane thereof. As the surface having a dangling bond density of higher than $14.0\ nm^{-2}$, there are further mentioned a (10-1-1) plane, a (000-1) plane and a (10-12) plane in addition to the above. The (hklm) plane in a hexagonal system crystal structure may not always be strictly a (hklm) plane in the present patent application, but may include a direction falling within $\pm 5°$, preferably within $\pm 3°$, more preferably within $\pm 1°$, even more preferably within $\pm 0.5°$, still more preferably within $\pm 0.1°$.

Regarding the −c plane, in case where the surface is an N atom-terminated end, the dangling bond density therein is computed to be $11.4\ nm^{-2}$, like in the +c plane. However, the N atom-terminated end is energically unstable, and therefore, in general, there may occur surface reconstruction. The surface reconstruction occurs as the surface atoms move in a new equivalent position or in such a manner that the surface energy could be minimized. For example, in Physical Review Letters, Vol. 79, p. 3934 (1977), Smith et al., it is reported that the −c plane is not substantially at the N atom terminal but an additional one Ga atom layer is added thereto. In the present invention, the −c plane is meant to indicate such a Ga atom terminated end, and the dangling bond density in the −c plane in this case is $34.2\ nm^{-2}$, three times in plane.

In the invention, the Group-III nitride semiconductor substrate is so formed that it has at least one surface having a dangling bond density of higher than $14.0\ nm^{-2}$. Preferably, it is so formed that the main face of the Group-III semiconductor substrate could be the surface having a dangling bond density of higher than $14.0\ nm^{-2}$. More preferably, it is so formed that the broadest face of the Group-III semiconductor substrate could be the surface having a dangling bond density of higher than $14.0\ nm^{-2}$.

For more favorably enjoying the effect of the cleaning effect to be mentioned below, preferably, the Group-III nitride semiconductor substrate has at least one surface having a dangling bond density of higher than $14.0\ nm^{-2}$, more preferably at least one surface having a dangling bond density of higher than $16.0\ nm^{-2}$, even more preferably at least one surface having a dangling bond density of higher than $18.0\ nm^{-2}$, still more preferably at least one surface having a dangling bond density of higher than $20.0\ nm^{-2}$.

(Thickness of Group-III Nitride Semiconductor Substrate)

The thickness of the shaped Group-III nitride semiconductor substrate is preferably at least 100 μm, more preferably at least 200 μm, even more preferably at least 300 μm. The thickness as referred to herein means the thickness of the substrate in the normal line direction relative to the broadest surface thereof. When the thickness is at least 300 μm, then the mechanical strength of the substrate is high and the substrate is easy to handle.

<<Polishing of Group-III Nitride Semiconductor Substrate>>

(Polishing Method and Abrasive Particles)

After shaped, the Group-III nitride semiconductor substrate is preferably polished. Polishing the Group-III nitride semiconductor substrate generally comprises three steps of grinding, lapping and final polishing; however, so far as the desired surface condition could be attained, one or two of these steps may be omitted.

The crystal of the Group-III nitride semiconductor substrate has a high hardness, for which, therefore, preferably used are abrasive particles of essentially diamond. In the final polishing, preferably, the substrate is polished with abrasive particles having a lower hardness than diamond for the purpose of removing the damage given thereto in working with diamond abrasive. Concretely, there may be mentioned alumina and colloidal silica; and preferred is polishing the substrate with colloidal silica.

Preferably, the particle size of the abrasive particles is so designed that it becomes smaller with the progress of the polishing process. The particle size of the abrasive particles for use in final polishing in the invention is preferably at most 200 nm, more preferably at most 150 nm, even more preferably at most 100 nm, still more preferably at most 80 nm. The time of polishing with such particles varies depending on the degree of the intended surface roughness, but in general, it may be from 1 to 30 hours, preferably from 1 to 20 hours, more preferably from 1 to 10 hours.

The abrasive may contain an oxidizing agent, a surfactant and the like in addition to the above-mentioned abrasive particles. Polishing with the abrasive may be attained by dropwise applying the abrasive onto a pad of urethane, unwoven fabric or the like.

<<Cleaning of Group-III Nitride Semiconductor Substrate>>

(Characteristic Feature of the Invention)

The invention is characterized by including cleaning the surface constituting the Group-III nitride semiconductor substrate and having a dangling bond density of higher than $14.0\ nm^{-2}$, with a cleaning agent containing an ammonium salt. In the invention, any other surface constituting the Group-III nitride semiconductor substrate may be cleaned along with the surface having a dangling bond density of higher than $14.0\ nm^{-2}$. The dangling bond density in the other surface as referred to herein may be higher than $14.0\ nm^{-2}$ or may be lower than $14.0\ nm^{-2}$.

The surface having a dangling bond density lower than 14.0 nm$^{-2}$ that constitutes the Group-III nitride semiconductor substrate may be cleaned according to any other conventional method separately from the cleaning in the invention. The explanation of the dangling bond density is as mentioned above.

(Cleaning Agent)

The cleaning agent for use in the cleaning method for the Group-III nitride semiconductor substrate of the invention contains an ammonium salt. Specific examples of the ammonium salt include ammonium halides such as ammonium fluoride (NH$_4$F) ammonium chloride (NH$_4$Cl), ammonium bromide (NH$_4$Br), etc.; ammonium carbonate, ammonium nitrate, ammonium sulfate, ammonium hydroxide, ammonium phosphate, ammonium phosphonate, etc. Preferred are ammonium halides; and more preferred is ammonium fluoride. One or more of these ammonium salts may be used either singly or as combined. In case where two or more such salts are used as combined, a cleaning agent comprising two or more ammonium salts as combined may be used, or cleaning agents separately containing the respective ammonium salts may be used successively.

The cleaning agent for use in the cleaning method for the Group-III nitride semiconductor substrate of the invention may contain hydrogen fluoride (HF), an oxidizing gent, a surfactant and the like, in addition to the ammonium salt. The concentration of the ammonium salt in the cleaning agent for use in the invention is preferably from 1.4 to 20% by mass, more preferably from 2 to 15% by mass, even more preferably from 3 to 9% by mass. The concentration of the other ingredient (e.g., HF) than the ammonium salt in the cleaning agent for use in the invention is preferably from 0 to 5% by mass, more preferably from 0 to 2% by mass, even more preferably from 0 to 1% by mass. The pH of the cleaning agent for use in the invention is preferably from 6.0 to 8.5, more preferably from 6.5 to 8.0, even more preferably from 6.9 to 7.4.

Washing with the cleaning agent containing an ammonium salt may be attained by contacting the surface having a dangling bond density of higher than 14.0 nm$^{-2}$ that constitutes the Group-III nitride semiconductor substrate with the cleaning agent. Preferably, it is attained by dipping the surface having a dangling bond density of higher than 14.0 nm$^{-2}$ that constitutes the Group-III nitride semiconductor substrate, in the cleaning agent; more preferably by dipping entirely the Group-III nitride semiconductor substrate in the cleaning agent. As other cleaning methods, also employable herein are a method of applying a flow of the cleaning agent intermittently or continuously to the surface having a dangling bond density of higher than 14.0 nm$^{-2}$ to thereby clean it; a scrub cleaning method with a brush or the like; and a cleaning method with ultrasonic waves.

The cleaning temperature with the cleaning agent in the invention is preferably from 10 to 60° C., more preferably from 15 to 40° C., even more preferably from 20 to 30° C. The cleaning time is preferably from 5 to 300 seconds, more preferably from 10 to 180 seconds, even more preferably from 30 to 90 seconds.

(Post-Treatment)

After cleaned with the cleaning agent, the Group-III nitride semiconductor substrate is preferably post-treated to thereby washing away the cleaning agent remaining on the substrate surface. Concretely, a water flow may be applied to the cleaned surface of the Group-III nitride semiconductor substrate or the substrate may be dipped in water to thereby wash away the cleaning agent. After the cleaning agent is washed away, preferably, the surface of the Group-III nitride semiconductor substrate is dried using a spin drier.

<<Group-III Nitride Semiconductor Substrate>>
(Characteristic Feature of the Invention)

The Group-III nitride semiconductor substrate cleaned according to the cleaning method of the invention is characterized by having a flat surface having a dangling bond density of higher than 14.0 nm$^{-2}$. The surface roughness (RMS) of the cleaned surface is at most 0.1 nm, preferably at most 0.9 nm, more preferably at most 0.8 nm, even more preferably at most 0.7 nm. The surface roughness (RMS) as referred to herein may be measured with an atomic force microscope (AFM).

The Group-III nitride semiconductor substrate of the invention is not always required to be such that the entire surface having a dangling bond density of higher than 14.0 nm$^{-2}$ of the substrate has a surface roughness (RMS) of at most 0.1 nm, but so far as at least a partial region of the surface has a surface roughness (RMS) of at most 0.1 nm, then the case falls within the range of the Group-III nitride semiconductor substrate of the invention. Preferably, however, the surface roughness (RMS) of the entire surface is at most 0.1 nm. Regarding the explanation and the embodiments of the surface having a dangling bond density of higher than 14.0 nm$^{-2}$, referred to are those given in the above description.

On the Group-III nitride semiconductor substrate cleaned according to the cleaning method of the invention, the abrasive agent having a particle size of at most 200 nm used in the above-mentioned polishing step is not detected. "Not detected" as referred to herein means that, when the cleaned surface having an area of 10×10 μm square is observed with an atomic force microscope (AFM), no particles having a particle size of at most 200 nm are detected. The surface roughness as referred to in the invention is a value of RMS obtained in scanning a 1×1 μm-square sample of the substrate by AFM.

(Application of Group-III Nitride Semiconductor Substrate)

The Group-III nitride semiconductor substrate of the invention has many applications. For example, it is useful as substrates for light-emitting devices on a relatively short wavelength side, for example, UV, blue, green or the like light-emitting diodes, semiconductor diodes, etc., or for semiconductor devices, for example, high-frequency and high-power electronic devices such as HEMT, HBT, etc. In particular, in InGaN-based blue or green LED and LD comprising the Group-III nitride semiconductor substrate of the invention, a piezoelectric field does not form in the direction of the growth axis thereof, and therefore, the devices may keep high internal quantum efficiency and high external quantum efficiency. Using the Group-III nitride semiconductor substrate of the invention as a base substrate, it is possible to produce a further larger Group-III nitride crystal.

EXAMPLES

The characteristic features of the invention are described more concretely with reference to Examples and Comparative Examples given below. In the following Examples, the material used, its amount and the ratio, the details of the treatment, the treatment process and others may be suitably modified or changed not overstepping the gist and the scope of the invention. Comparative Examples are shown not for the purpose of limiting the scope of the present invention but for the purpose of providing comparative examples inferior to better examples of the invention. Accordingly, the invention should not be limitatively interpreted by the Examples and the Comparative Examples mentioned below.

Production Example

Crystal Growth and Formation of Substrate

Using a sapphire substrate having a diameter of 2 inches and a thickness of 430 μm as the base substrate, a (0001) plane of GaN was grown to a thickness of 2 μm thereon according to an MOCVD method, thereby preparing a 2-inch GaN template substrate. Next, the template substrate was disposed in the reactor unit of an HVPE apparatus, then the growing temperature was elevated up to 1040° C., and thereafter while a carrier gas of substantially $H_2$ alone, a GaCl gas of a reaction product of Ga and HCl, and an $NH_3$ gas were supplied onto the base GaN layer, the GaN layer was grown for about 40 hours. During the growing step, the pressure in growth was $1.01 \times 10^5$ Pa, the partial pressure of the GaCl gas was $3.07 \times 10^2$ Pa, and the partial pressure of the $NH_3$ gas was $1.27 \times 10^4$ Pa. After the growth, this was cooled to room temperature thereby giving a GaN single crystal having a thickness of about 5 mm.

Next, using a wire saw-type apparatus, this was sliced. The distance between the wires was 700 μm, and the slicing speed was 1 mm/h. The wire diameter was suitably selected from a range of from 0.1 to 0.2 mm. The angle between the crystal and the wire saw was changed thereby producing a semi-polar plane GaN substrate and a −c plane GaN substrate having various surfaces. From 10 to 100 substrates were sliced in one slicing operation. The obtained GaN substrates were used in the following Examples and Comparative Examples.

Example 1

Cleaning of (11-22) Plane with $NH_4F$ Cleaning Agent

In this Example, used was the GaN substrate sliced to have a (11-2-2) plane in the above-mentioned slicing process.

Using a wax, the crystal was stuck to a ceramic block with its (11-2-2) plane kept outside. Using an abrasive slurry of diamond having a mean particle size of 15 μm, the (11-2-2) plane was lapped to remove the working damage in slicing. Next, the ceramic block was put on a hot plate to melt the wax, thereby releasing the substrate from the ceramic block. The substrate was dipped in hot isopropyl alcohol (hereinafter referred to as IPA) to remove the wax. The (11-2-2) plane had the remaining damage caused by lapping with the diamond having a mean particle size of 15 μm. The substrate was etched by dipping it in a KOH solution having a concentration of 50% and heated at 100° C. or higher, thereby completely removing the lapping damage. Subsequently, using a wax, the substrate was stuck to a ceramic block with its (11-22) plane kept outside. Like the (11-2-2) plane thereof, this was lapped with the abrasive slurry of diamond to remove the working damage in slicing, and thereafter the (11-22) plane was polished for 3 hours with an abrasive slurry of colloidal silica having a mean particle size of 80 nm. Subsequently, with its surface kept wetted, the substrate was immediately set in a substrate washer (surface scraper), and the abrasive residue and the particles on the substrate surface were washed away using a surfactant. The large contaminants were removed in this step, but when the substrate surface was observed with AFM or SEM, then colloidal silica agglomerates of a few μm or so in size remained thereon. After the washing, the ceramic block with the substrate stuck thereto was heated on a hot plate at 100° C. to melt the wax, whereby the polished substrate was peeled from the ceramic block. The peeled substrate was dipped in hot IPA to remove the wax.

Subsequently, the substrate was washed with an $NH_4F$-containing cleaning agent for the purpose of removing the colloidal silica still remaining after the washing with the substrate washer. A cleaning agent was prepared by mixing $NH_4F$ (aqueous solution having a concentration of 40%)/HF (aqueous solution having a concentration of 50%)/$H_2O$=50/1/200 by volume, and the substrate was washed in it for 1 minute. The cleaning agent had a pH of 7.2, and the temperature was room temperature (20 to 30° C.). Next, the substrate was rinsed with pure water (flowing water) to well remove the cleaning agent, and then dried in a spin drier to remove water thereby giving a GaN substrate having a cleaned (11-22) plane as the main face thereof. An area of 10×10 μm square of the substrate was scanned with AFM to observe the (11-22) plane thereof, and no remaining colloidal silica was detected at all. In addition, an area of 1×1 μm square of the substrate was scanned with AFM to observe the (11-22) plane thereof, which confirmed an extremely flat surface of the plane with RMS=0.093 nm.

Example 2

Cleaning of (11-22) Plane with $NH_4Cl$ Cleaning Agent

The substrate was processed in the same manner as in Example 1, for which, however, a cleaning agent of $NH_4Cl$ (aqueous solution having a concentration of 40%)/HF (aqueous solution having a concentration of 50%)/$H_2O$=50/1/200 was used, thereby giving a GaN substrate having a cleaned (11-22) plane as the main face thereof. Like in Example 1, the (11-22) plane of the substrate was observed with a microscope, and no remaining colloidal silica was detected at all. In addition, the (11-22) plane was observed with AFM, and its RMS was 0.098 nm, therefore confirming an extremely flat surface of the plane like in Example 1.

Example 3

Cleaning of −c Plane with $NH_4F$ Cleaning Agent

The substrate was processed in the same manner as in Example 1; however, its −c plane was polished. Thus, a GaN substrate having a cleaned −c plane as the main face thereof was obtained. Like in Example 1, the −c plane was observed with a microscope, and no remaining colloidal silica was detected at all. In addition, the −c plane was observed with AFM, and its RMS was 0.072 nm, therefore confirming an extremely flat surface of the plane like in Example 1.

Example 4

Cleaning of (10-1-1) Plane with $NH_4F$ Cleaning Agent

The substrate was processed in the same manner as in Example 1; however, its (10-1-1) plane was polished. Thus, a GaN substrate having a cleaned (10-1-1) plane as the main face thereof was obtained. Like in Example 1, the (10-1-1) plane was observed with a microscope, and no remaining colloidal silica was detected at all. In addition, the (10-1-1) plane was observed with AFM, and its RMS was 0.082 nm, therefore confirming an extremely flat surface of the plane like in Example 1.

Example 5

Cleaning of (1-101) Plane with $NH_4F$ Cleaning Agent

The substrate was processed in the same manner as in Example 1; however, its (1-101) plane was polished. Thus, a GaN substrate having a cleaned (1-101) plane as the main face thereof was obtained. Like in Example 1, the (1-101) plane was observed with a microscope, and no remaining colloidal silica was detected at all. In addition, the (1-101) plane was observed with AFM, and its RMS was 0.095 nm, therefore confirming an extremely flat surface of the plane like in Example 1.

Example 6

Cleaning of (10-12) Plane with $NH_4F$ Cleaning Agent

The substrate was processed in the same manner as in Example 1; however, its (10-12) plane was polished. Thus, a GaN substrate having a cleaned (10-12) plane as the main face thereof was obtained. Like in Example 1, the (10-12) plane was observed with a microscope, and no remaining colloidal silica was detected at all. In addition, the (10-12) plane was observed with AFM, and its RMS was 0.089 nm, therefore confirming an extremely flat surface of the plane like in Example 1.

Comparative Example 1

Cleaning of (11-22) Plane with Fluoric Acid Cleaning Agent

The substrate was processed in the same manner as in Example 1, for which, however, a cleaning agent of HF (aqueous solution having a concentration of 50%)/$H_2O$=1/50 was used, thereby giving a GaN substrate having a cleaned (11-22) plane as the main face thereof. Like in Example 1, the (11-22) plane of the substrate was observed with a microscope, and no remaining colloidal silica was detected at all. In addition, the (11-22) plane was observed with AFM, and its RMS was 6.602 nm. This confirmed that the surface was extremely roughened.

Comparative Example 2

Cleaning of (11-22) Plane with Alkali Cleaning Agent

The substrate was processed in the same manner as in Example 1, for which, however, a cleaning agent of high-purity KOH solution (having a concentration of 50%) was used, thereby giving a GaN substrate having a cleaned (11-22) plane as the main face thereof. Like in Example 1, the (11-22) plane of the substrate was observed with a microscope, and no remaining colloidal silica was detected at all. In addition, the (11-22) plane was observed with AFM, and its RMS was 2.305 nm. This confirmed that the surface was extremely roughened.

Comparative Example 3

Cleaning of (11-22) Plane with Diluted Alkali Cleaning Agent

The substrate was processed in the same manner as in Example 1, for which, however, a cleaning agent of high-purity KOH solution (having a concentration of 50%)/$H_2O$=1/10 was used, thereby giving a GaN substrate having a cleaned (11-22) plane as the main face thereof. Like in Example 1, the (11-22) plane of the substrate was observed with a microscope, and colloidal silica remaining on the surface was detected. This confirmed that the cleaning effect was insufficient.

Comparative Example 4

Cleaning of (0001) Plane with $NH_4F$ Cleaning Agent

The substrate was processed in the same manner as in Example 1; however, its (0001) plane was polished. Thus, a GaN substrate having a cleaned (0001) plane as the main face thereof was obtained. Like in Example 1, the (0001) plane was observed with a microscope, and no remaining colloidal silica was detected. In addition, the (0001) plane was observed with AFM, and its RMS was 0.252 nm. In this, the cleaned surface was roughened more than in a case of cleaning with a cleaning agent of HF (aqueous solution having a concentration of 50%)/$H_2O$=1/50 where RMS was 0.152 nm.

Comparative Example 5

Cleaning of (1-100) Plane with $NH_4F$ Cleaning Agent

The substrate was processed in the same manner as in Example 1; however, its (1-100) plane was polished. Thus, a GaN substrate having a cleaned (1-100) plane as the main face thereof was obtained. Like in Example 1, the (1-100) plane was observed with a microscope, and no remaining colloidal silica was detected. In addition, the (1-100) plane was observed with AFM, and its RMS was 0.178 nm. In this, the cleaned surface was roughened more than in a case of cleaning with a cleaning agent of HF (aqueous solution having a concentration of 50%)/$H_2O$=1/50 where RMS was 0.072 nm.

Comparative Example 6

Cleaning of (11-20) Plane with $NH_4F$ Cleaning Agent

The substrate was processed in the same manner as in Example 1; however, its (11-20) plane was polished. Thus, a GaN substrate having a cleaned (11-20) plane as the main face thereof was obtained. Like in Example 1, the (11-20) plane was observed with a microscope, and no remaining colloidal silica was detected. In addition, the (11-20) plane was observed with AFM, and its RMS was 0.174 nm. In this, the cleaned surface was roughened more than in a case of cleaning with a cleaning agent of HF (aqueous solution having a concentration of 50%)/$H_2O$=1/50 where RMS was 0.093 nm.

INDUSTRIAL APPLICABILITY

According to the invention, a Group-III nitride semiconductor substrate having a flat surface with a dangling bond density of higher than 14.0 $nm^{-2}$ can be provided efficiently and in a simplified manner. Also according to the invention, abrasive grains having a small grain size and remaining on the surface of a Group-III nitride semiconductor substrate after a polishing step for it can be removed in a simplified manner. Accordingly, the Group-III nitride semiconductor substrate of the invention is useful as substrates for light-emitting devices on a relatively short wavelength side, for example, UV, blue, green or the like light-emitting diodes, semiconductor diodes, etc., or for semiconductor devices, for example, high-frequency and high-power electronic devices such as HEMT, HBT, etc. Therefore, the industrial applicability of the invention is great.

The invention claimed is:

1. A Group-III nitride semiconductor substrate containing a surface that has a dangling bond density of higher than 18.0 $nm^{-2}$ and has a surface roughness (RMS) of at most 0.1 nm, and has a thickness of at least 100 μm.

2. A Group-III nitride semiconductor substrate containing a surface that has a dangling bond density of higher than 18.0 $nm^{-2}$ and has a surface roughness (RMS) of at most 0.1 nm, and when the cleaned surface having an area of 10×10 μm square is observed with an atomic force microscope (AFM), no particles having a particle size of at most 200 nm being detected.

3. The Group-III nitride semiconductor substrate according to claim 1, wherein the surface having a dangling bond density of higher than 18.0 $nm^{-2}$ and having a surface roughness (RMS) of at most 0.1 nm is a (20-21) plane.

4. The Group-III nitride semiconductor substrate according to claim 1, wherein the surface having a dangling bond density of higher than 18.0 $nm^{-2}$ and having a surface roughness (RMS) of at most 0.1 nm is a (000-1) plane.

5. The Group-III nitride semiconductor substrate according to claim 1, wherein the surface having a dangling bond density of higher than 18.0 $nm^{-2}$ and having a surface roughness (RMS) of at most 0.1 nm is a (10-1-1) plane.

6. The Group-III nitride semiconductor substrate according to claim 2, wherein the surface having a dangling bond density of higher than 18.0 $nm^{-2}$ and having a surface roughness (RMS) of at most 0.1 nm is a (20-21) plane.

7. The Group-III nitride semiconductor substrate according to claim 2, wherein the surface having a dangling bond density of higher than 18.0 $nm^{-2}$ and having a surface roughness (RMS) of at most 0.1 nm is a (000-1) plane.

8. The Group-III nitride semiconductor substrate according to claim 2, wherein the surface having a dangling bond density of higher than 18.0 $nm^{-2}$ and having a surface roughness (RMS) of at most 0.1 nm is a (10-1-1) plane.

* * * * *

UNITED STATES PATENT AND TRADEMARK OFFICE
CERTIFICATE OF CORRECTION

| | | |
|---|---|---|
| PATENT NO. | : 8,022,413 B2 | |
| APPLICATION NO. | : 13/082916 | |
| DATED | : September 20, 2011 | |
| INVENTOR(S) | : Kenji Fujito et al. | |

It is certified that error appears in the above-identified patent and that said Letters Patent is hereby corrected as shown below:

On the title page, Item (73), the Assignee's name is incorrect. Item (73) should read:

-- (73) Assignee: Mitsubishi Chemical Corporation, Tokyo (JP) --

Signed and Sealed this
Fifteenth Day of November, 2011

David J. Kappos
*Director of the United States Patent and Trademark Office*